US006438514B1

(12) United States Patent
Hill et al.

(10) Patent No.: US 6,438,514 B1
(45) Date of Patent: Aug. 20, 2002

(54) GENERATION OF A SYSTEM MODEL

(75) Inventors: Mark Hill, Bath; Hendrick-Jan Agterkamp, Bristol; Andrew Sturges, Bath, all of (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 0 days.

(21) Appl. No.: 09/444,680

(22) Filed: Nov. 22, 1999

(30) Foreign Application Priority Data

Dec. 29, 1998 (GB) .............................. 9828794

(51) Int. Cl.[7] ................................ G06F 9/44

(52) U.S. Cl. ............................ 703/17; 703/14; 703/26; 714/33; 717/116; 712/202

(58) Field of Search ............................... 703/2, 14, 17, 703/20, 22, 16, 26; 714/33; 709/303, 304; 712/202; 717/116

(56) References Cited

U.S. PATENT DOCUMENTS

| 5,848,236 A | * | 12/1998 | Dearth et al. | .......... | 395/183.09 |
| 5,857,071 A | * | 1/1999 | Haley et al. | ........... | 395/183.14 |
| 6,249,803 B1 | * | 6/2001 | Jindal et al. | ................. | 707/103 |

OTHER PUBLICATIONS

Sykes D. A. et al., *The Design of an Efficient Simulator for the Pentium Pro Processor*, 1996 Winter Simulation Conference Proceedings, Coronado, CA, Dec. 8–11, 1996, pp 840–847.

Ibbett R. N. et al., *Hase: A Flexible Toolset for Computer Architects*, Computer Journal, vol. 38, No. 10, Jan. 1, 1995 pp 755–764, XP000584673.

Database Inspec Institute of Electrical Engineers, Sevenage, GB, Inspec No. 6039125, Abbattista F. et al., *Object Oriented Design of Architectures at the Instruction Set Level*, XP002095278 & Proceedings of the Fifteenth Iasted International Conf. Applied Informatics, Proceedings of Iasted 15th International Conference on Applied Informatics, Innsbruck, Austria, Feb. 18–20, 1997, pp 58–62, ISBN 0–88986–219–2, 1997 Anaheim CA, Iasted, USA, 1 page of Abstract.

Maturanan G. et al., Incas: *A Cycle Accurate Model of Ultrasparctm*, International Conference on Computer Design: VLSI in Computers and Processors, Austin, Oct. 4, 1995, pp 130–135, XP000631904.

\* cited by examiner

Primary Examiner—Kevin J. Teska
Assistant Examiner—T. Phan
(74) Attorney, Agent, or Firm—Wolf, Greenfield & Sacks, P.C.; James H. Morris; Robert A. Skrivanek, Jr.

(57) ABSTRACT

A computer is operated to generate electronic data defining a system model by loading into the computer a class definition defining instructions which are processed by the system, the definition including a set of functional methods to which the instruction is subjected by the system and a set of locations for members representing the instruction. A model execution program is then executed on the computer which calls the class definition for each instruction, invokes one of the functional methods and loads the locations of the entry with state information depending on the functional method to create a functional component. The functional component is loaded into memory and the state information of the functional component modified independence on a subsequently invoked functional method by the model execution program.

The class definitions may be one of the members and may be the address of the instruction in a memory of the processor being modelled, a record of any loops caused by the instruction, the opcode of the instruction describing the effect of the instruction when executed, a pointer to a description of the effect of the instruction when executed or an array of operands including input and output operant values for the instructions.

17 Claims, 4 Drawing Sheets

GENERATION OF A SYSTEM MODEL

FIELD OF THE INVENTION

This invention relates to a computer system for generating a system model, particularly but not exclusively to generation of a processor model.

BACKGROUND OF THE INVENTION

There are two approaches commonly taken when implementing performance models of devices. The first is to produce a low level model of each component of the device and then connect up these component models to produce a complete simulation. This activity may be performed in numerous ways, for example, using a hardware description language such as VHDL or Verilog. The main benefit of this is that synthesis techniques for these languages are quite mature, making it possible to generate silicon directly from the description. Another example is a conventional programming language such as C/C++. The main benefits of taking this approach are that models tend to run quicker than VHDL/Verilog simulations, will typically run independently of any proprietary simulation environment (which may be essential if the model is to be used by customers) and will still integrate quickly and cleanly into any proprietary environment in which it is required. A further example is a graphical modelling tool, such as CAE-Plus's Archgen. This has the benefit of being able to produce reasonably fast C models, but also generate VHDL/Verilog which can be used when a path to synthesis is required.

The main failings of this strategy are as follows.

It is a labour intensive approach, the cost of which is difficult to justify unless the model itself forms part of the design flow from architecture to silicon (as is typically the case for a VHDL/Verilog model say). It certainly makes no sense to try and develop, maintain and keep consistent two low-level models, say one written in C and the other in VHDL (though this is frequently attempted).

The model is functionally useless until it is virtually complete, that is, it is unlikely that the model will be able to run any benchmark code until very late in the design process.

The production of such models is totally dependent upon the complete (micro)architecture of the chip having been specified, and must track any changes to this specification. Again, this means that the model will turn up very late in the process.

Not only must the performance model track changes in the (micro)architecture specification it must also track the iterations in the architecture specification.

This late delivery of the model means that, although it should be of use for performance verification of the device, it will provide no support for the many activities which would benefit from the existence of early performance models.

The second approach uses a technique called trace driven simulation. This involves taking an instruction trace of a piece of code run on the functional simulator and feeding this to a model of the device. The main problems with this technique are that it is inevitably imprecise as it is based on imperfect information, for example, the performance model never has any visibility of instructions partially executed on any mispredicted path. Moreover, this technique cannot be used during any system performance modelling as the post-mortem nature of trace simulation means that the model cannot react to its environment.

It is an aim of the invention to mitigate or reduce these problems.

SUMMARY OF THE INVENTION

According to one aspect of the present invention there is provided a method of operating a computer to generate electronic data defining a system model, the method comprising: loading into the computer a class definition defining functional objects which are processed by the system, the definition including a set of functional methods to which the object is subjected by the system and a set of locations for members representing the object; executing on the computer a model execution program which calls the class definition for each object, invokes one of the functional methods and loads the locations of the entry with state information depending on the functional method to create a functional component; loading said functional component into an electronic storage medium wherein; and modifying the state information of the functional component in dependence on a subsequently invoked functional method by the model execution program.

Another aspect of the invention provides a computer system operable to generate electronic data defining a system model, the computer system comprising: a memory for holding class definition defining functional objects which are processed by the system, the definition including a set of functional methods to which the object is subjected by the system and a set of locations for members representing the objects; a processor for executing a model execution program which calls the class definition for each object, invokes one of the functional methods and loads the locations of the entry with state information depending on the functional method to create and modify functional components; and an electronic storage medium in which said functional components are stored and modified to generate the system model.

In the example described herein, the system is a processor and the objects are instructions to be executed by the processor.

At the heart of the invention is the separation of the function of the device from its performance. This is achieved by generating the functional model in such a way that its individual components are suitable for re-use within a performance model. For implementing a performance model, a timing method can be associated with each functional component. Note that this does not usually require specific knowledge of a particular implementation. For example, when developing a functional model of a processor, a functional component for execution of an instruction is arranged to read its source operands and write any results to its destination operands, rather than modify a register file directly. Thus, the instruction state (the destination operand result) is decoupled from the processor state (the register file). This arrangement means that in a performance model of a simple pipeline (with fetch, decode, execute, writeback phases) register forwarding (a feedback loop from the output of the execute phase back to its input) can be implemented by copying a result operand from an instruction which has just executed to any dependent operands in the next instruction to be executed.

The model can be refined during the project, becoming ever more cycle-accurate until, if required, it exhibits precisely the same timing behaviour as the design. This gives flexibility to trade-off accuracy against time/cost.

As performance models are derived from functional models they always incorporate the required functionality, for example executing code. Moreover, they can track, virtually automatically, any changes in the architectural specification. As the model is not intended as the basis for any synthesis it is possible to perform the modelling at a higher level of abstraction. This allows the environment to support explorations of the (micro)architectural design space without a complete (micro)architecture specification and implementation having to be produced.

This early delivery of performance models incorporating functionality makes them amenable to supporting many activities which would otherwise have to rely on far less empirical techniques. For example cost vs. benefit trade-offs; (micro)architecture, such as explorations of various dynamic and static branch prediction techniques; toolchain optimisations, particularly instruction scheduling, and algorithm development; production of marketing data from running standard and customer benchmarks; and validation, that is, ensuring a particular design can meet the demands of the market to which it is targeted.

For a better understanding of the present invention and to show how the same may be carried into effect, reference will now be made by way of example to the accompanying drawings.

DESCRIPTION OF THE PREFERRED EMBODIMENTS OF THE INVENTION

The following example illustrates how the functional model of a simple processor architecture can be implemented in such a way that it is appropriate for reuse by the performance model. This is achieved by identifying what architectural information needs to be associated with a particular instruction instance to give it a correct view of the architectural state, that is, the state as it would be seen by the instruction if all instructions were being executed sequentially. For this example the instruction state contains the following information:

i) the program counter (pc), that is the address of the instruction;

ii) the opcode (opcode), that is the raw undecoded data found at the address of the instruction;

iii) the instruction (instr), this is a pointer to a description of the decoded instruction, it includes information about operand usage and an execute method which implements the function of the instruction;

iv) an array of operands (op), this contains local copies of all the input and output operand values to the instruction;

v) a record of any traps caused by the instruction (trap), this must be held with the instruction as it is not until an instruction reaches the final phase of execution that any trap it has raised is acted upon;

vi) a reference to the processor state (proc), this contains the complete architectural state at the point at which the last instruction completed its execution (that is, it was retired).

Associated with the instruction are a number of methods which implement the different logical phases of the execution of an instruction. These are:

a) fetch, which reads the contents of memory at the pc to get the opcode of the instruction;

b) decode, which decodes the fetched opcode;

c) register_fetch, which reads any source operands from the register file into the instruction states local copies;

d) execute, which executes the function of the instruction, writing to the destination operand of the instruction;

e) retire, which write the result operands back to the register file, and performs any updates to the pc, including any discontinuities introduced by control hazards such as traps or branches.

An appropriate class definition in the language C++ for the state and methods described above is shown in Annexe 1 and FIG. 1.

Figure 1:
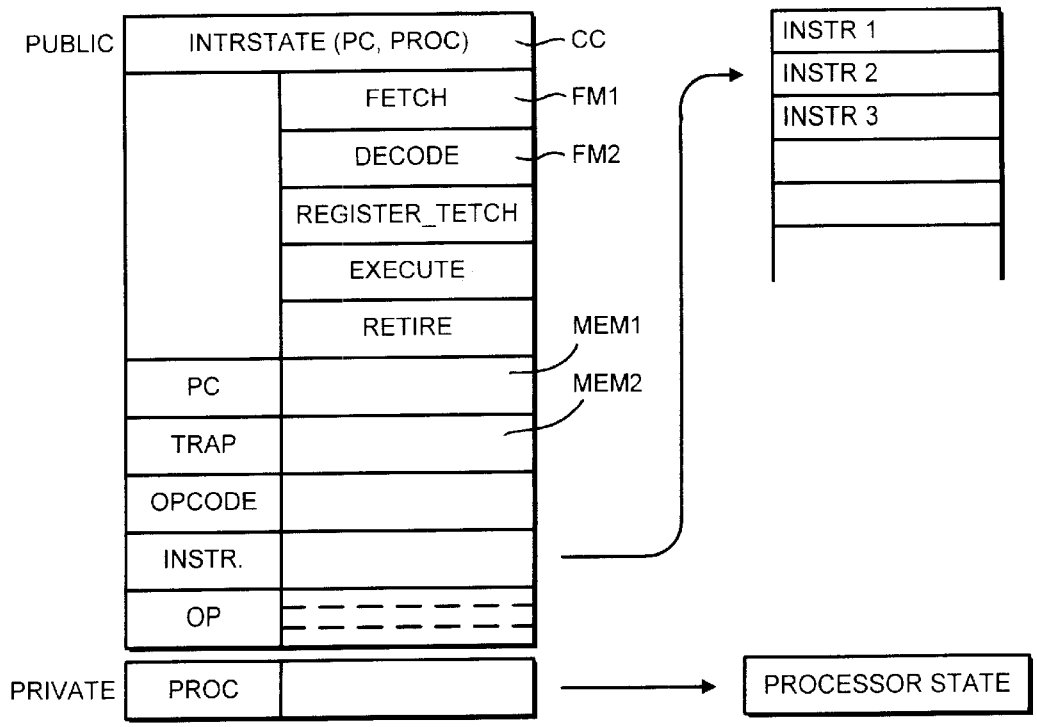
FIG. 1 is a diagram illustrating an instruction state class definition.

FIG. 1 is a diagram illustrating the class definition. The class definition comprises public and private parts. The class is constructed using a class constructor CC, called here InstrState, and allows each instruction within a class to be identified by its address (pc) in the memory of the processor being modelled and a reference to the processor state (proc) at the time the instruction is fetched from memory. The definition includes the functional methods a) to e) mentioned above, which are denoted in FIG. 1 FM1, FM2 etc. The definition also includes a plurality of class members, MEM1, MEM2 which are the items i) to vi) mentioned above. The instruction (instr) is shown diagrammatically as a pointer to an instruction definition ID in another part of memory. A reference to the processor state (proc) is held in the private part of the class definition and is capable of being loaded with changes in the processor state brought about by use of the class definition, so that it provides a comparison with the actual processor state in the system model.

Prior to executing a model, basic model data is established in the form of a set of instruction definitions ID which define an execute method for each instruction (Instr 1, Instr 2, etc). A decode table DT is also established which relates opcodes with execute methods. Functional methods defining functional components of a model are manually generated by a system designer and entered into the memory of a computer system.

Figure 2:
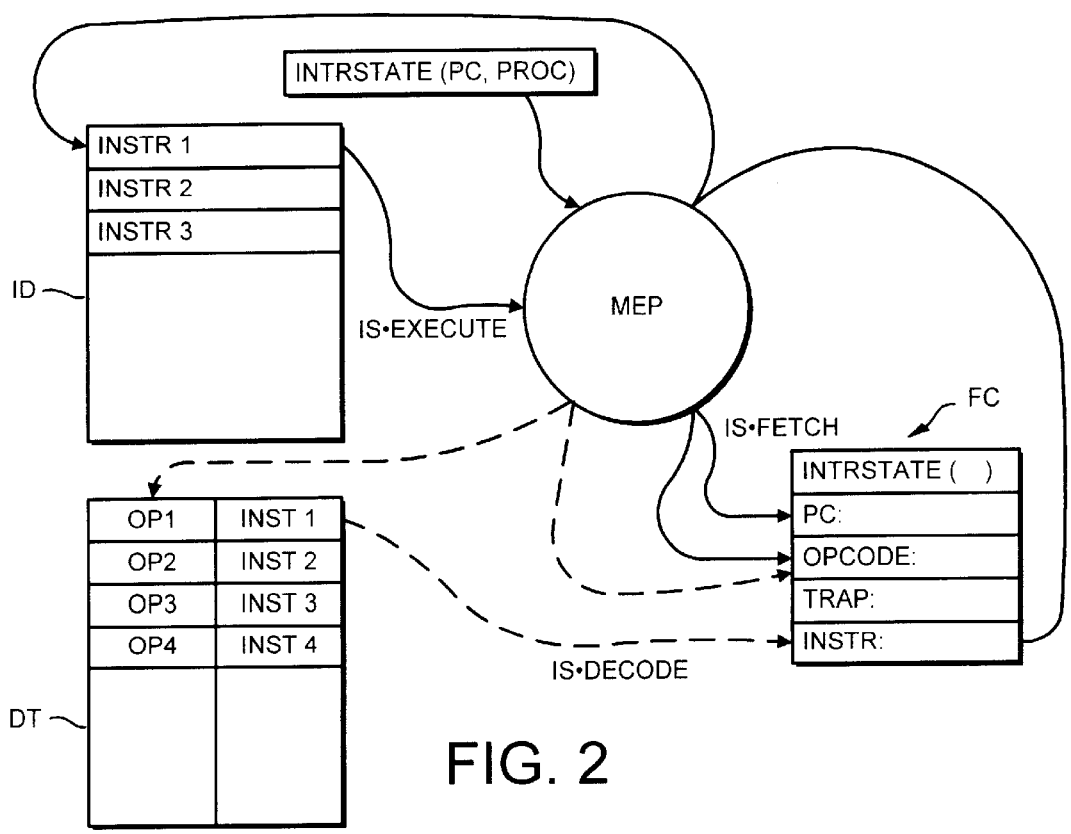
FIG. 2 is a schematic sketch illustrating use of the model execution program.

Reference is now made to FIG. 2 to show how a functional model may be implemented. In order to implement a functional model, only one instruction is ever in a process of being executed at a time. Thus, to advance the model what is needed is to create a single instance of the instruction state class and invoke each phase of instruction execution in turn. This is done by a model execution program MEP. The model execution program MEP has access to a database which holds the class definition (class constructor InstrState), the instruction definitions and the decode table DT. An instruction is identified in the database by its address (pc) in memory of the device being modelled. The program then generates a functional component FC by invoking a functional method and loading relevant state information into the class members for that functional method. For example, when the fetch method is invoked by if.fetch, the pc and opcode members are loaded with the address of the instruction and the opcode of the instruction. A subsequent functional method is then invoked, which in the given example is the decode method if.decode. According to this method, the opcode is associated with an instruction definition using the decode table and the instruction class member is loaded to modify the functional component. Subsequently, an execute method is invoked by the model execution program MEP and the instruction definition loaded in the instruction class member is used to determine the effect on the operands in the instruction state class.

In this way, a functional component is created and modified by the sequential invocation of different functional methods by execution the model execution program MEP. This is discussed more fully in relation to the pipeline example given later.

Figure 3:
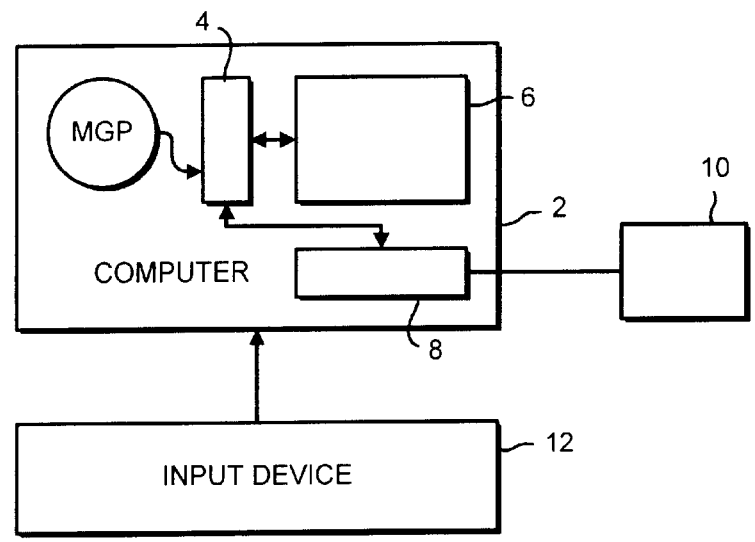
FIG. 3 is a block diagram of a computer system for implementing the model execution program.

FIG. 3 is a schematic block diagram of a computer system capable of implementing the functional model defined above and the performance model to be described below. A computer 2 has a processor 4 capable of running the model execution program MEP. It also has a memory 6 which provides an electronic storage medium in which the functional components of the model can be stored and modified during execution of the model. In addition the memory 6 may, if it is sufficiently large, hold the database. Alternatively, the computer can have a memory reader 8 which can read external memory 10 attached to the computer and holding the database, for example in the form of a disk or similar means. The computer system also includes an input device 12 which can be a keyboard, mouse, disk-drive or any other suitable input means to allow a user to control execution of the model in cooperation with the model execution program.

When it comes to the implementation of a performance model multiple instances of the InstrState class need to be managed. This is necessary because, in any processor design worth implementing, the lifetimes of instructions are invariably heavily overlapped. Even though the lifetimes of instructions overlap it is (usually) necessary that the instruction stream should behave as if the instructions were being executed sequentially. To achieve this the performance model incorporates the mechanisms chosen by the microarchitects to manage the potential control and data hazards that the parallel execution of instructions cause. By way of an example, FIG. 4 is an illustration of the InstrState class previously described being used to provide the functional behaviour of instructions in a four stage pipeline design.

Figure 4:
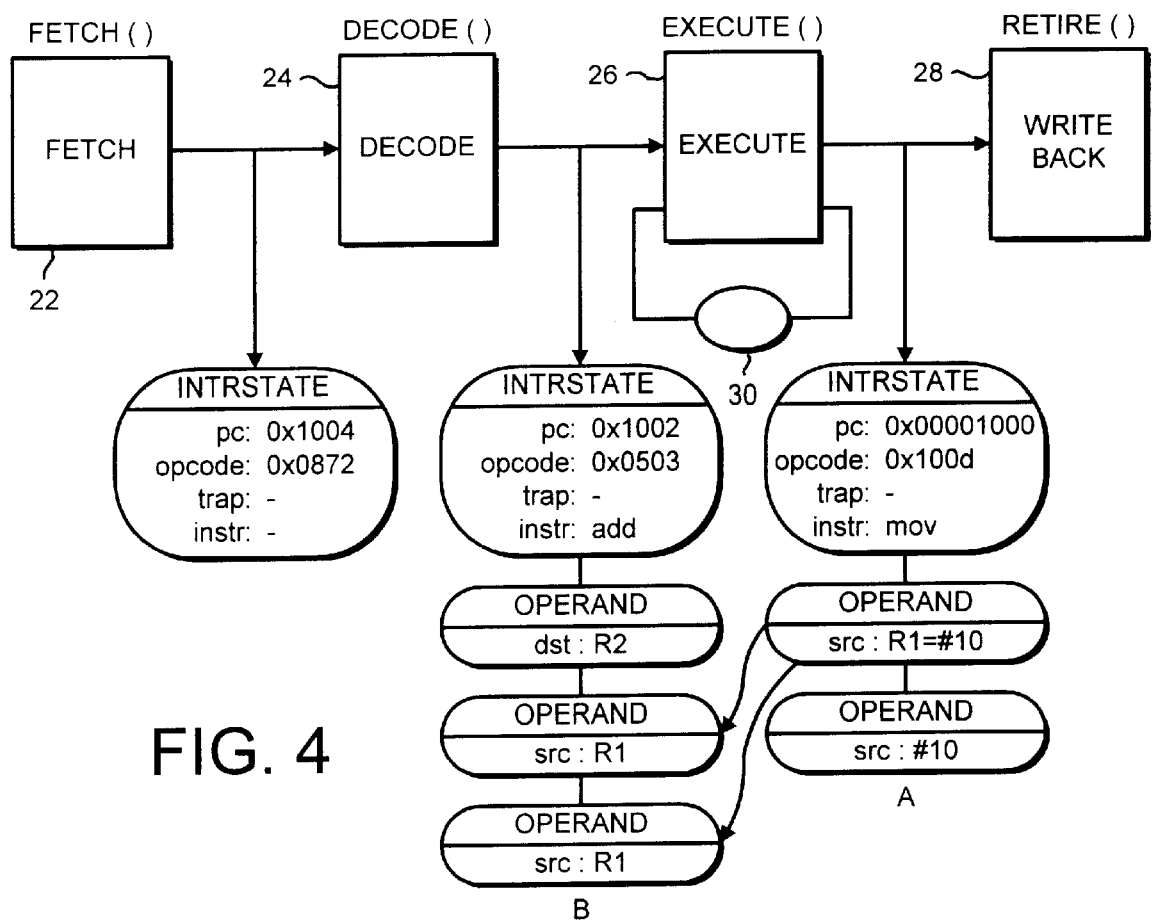
FIG. 4 is a diagram illustrating implementation of a model of a scalar pipeline.

The example of FIG. 4 is shown implementing a functional model of execution of the following sequence of code:

(a) 1000 100d mov #10, R1 (10,10)
(b) 1002 0503 add R1, R1, R2 (10,10,20)
(c) 1004 0872 mul R2, R1, R3

Figure 5:
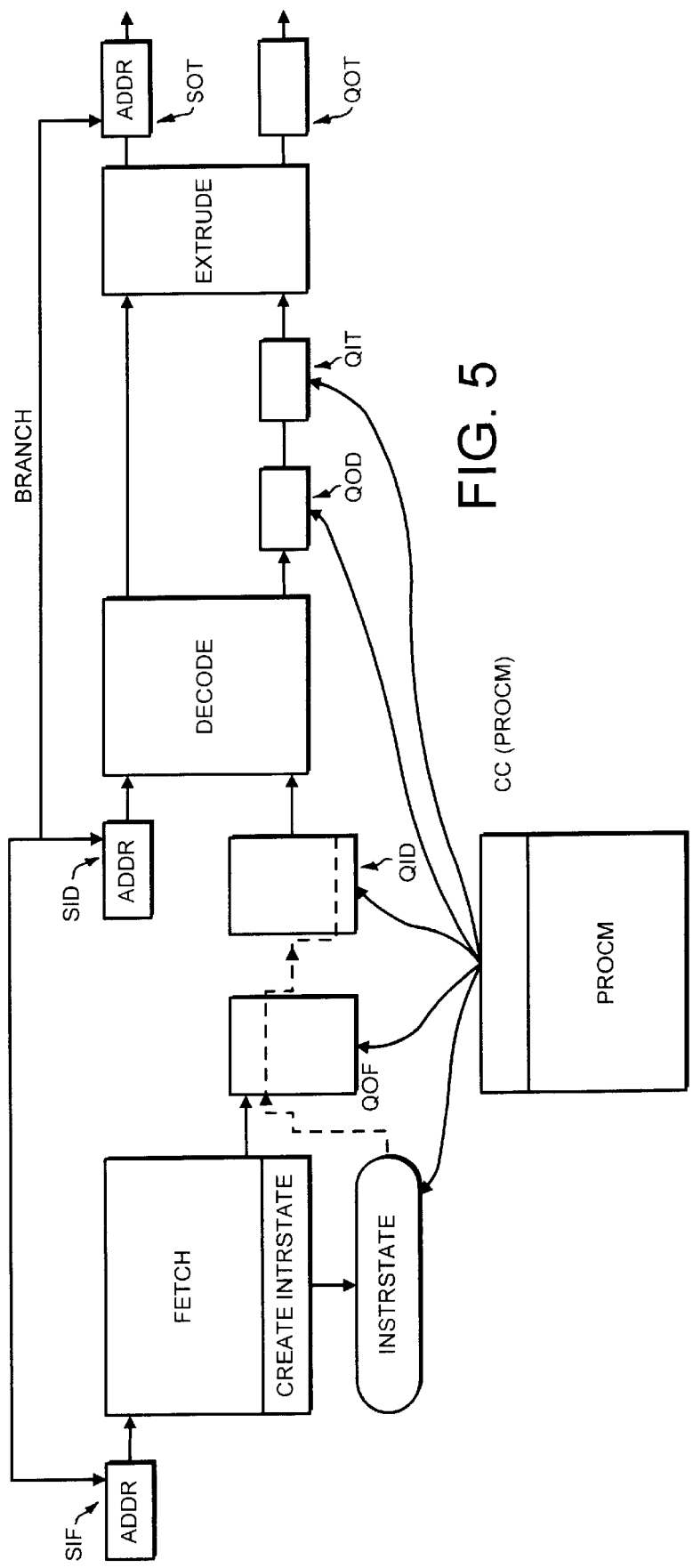
FIG. 5 is a more detailed diagram illustrating implementation of a model of a scaler pipeline.

The model of the pipeline includes a fetch phase 22, decode phase 24, execute phase 26 and write back phase 28. The pipeline is illustrated after three cycles of operation. At the first cycle, the first instruction (a) was fetched. At the second cycle, the first instruction (a) was decoded and the second instruction (b) was fetched. At the third cycle, the state illustrated in FIG. 4, the third instruction (c) is fetched, the second instruction (b) is decoded and the first instruction (a) is executed. Thus, a functional component is generated for the third instruction (c) by invoking the fetch method using the instruction state members pc and opcode as illustrated. The decode phase is modelled by invoking the decode method for the instruction state class for the second instruction (b). For the decode phase, the instr. member is needed and the operand information is included as the three separate members of the op location illustrated in FIG. 1. The execute phase is modelled by invoking the execute method using the instruction state class for the first instruction (a). Thus, instruction (a) was used to generate a functional component by invoking the fetch method, then that functional component was modified in the decode and execute phases by invoking the decode and execute methods and modifying the state information of the functional method accordingly. To implement the model, a decision needs to be made as to how to manage any difficulties arising in the particular code sequence. For the sample of code illustrated in FIG. 4, a read after write data hazard occurs, caused by the fact that when the operands for the second instruction (b) are read from the register file, the result of the first instruction (a) (which would update the register file in the write back phase) has not yet arrived at the write back phase. The mechanism chosen to overcome this hazard in this example is a piece of forwarding logic which recognises that an update to a register in the register file is pending and instead forwards the result from the later stage in the pipeline back to the input of the execute phase. This is illustrated diagrammatically by reference numeral 30 in FIG. 4. In a more complex design which permits out of order execution for example, a different solution might be chosen for resolving this hazard. FIG. 5 illustrates in more detail how the performance model illustrated in FIG. 4 is constructed. As already mentioned, each phase of the pipeline is implemented as a separate C++ class. All inputs and outputs of each phase are declared as members of the class using template classes QueueInput<T>, QueueOutput<T>, SignalInput<T> and SignalOutput<T>. These are denoted in FIG. 5 by the first two letters defining the template class and the last letter being the initial of the stage with which the template class is associated. Thus, for example, SID denotes the SignalInput class for the decode phase. The QueueInput<T> and QueueOutput<T> classes provide a mechanism to pass particulate data items of type T from one object to another. The SignalInput<T> and SignalOutput<T> classes provide a mechanism to propagate data of type T freely amongst the components.

The queue input and queue output classes are used in the model to provide a way for the instruction state classes to flow through the model. As illustrated by way of example in FIG. 5, new instances of each instruction state class are created dynamically by the fetch method. The passage of an instruction to the subsequent decode phase is simulated by appending a pointer to the object (the instruction state class) into an output queue. The output queue of the fetch phase is labelled QOF in FIG. 5 and is modelled using the template class queue output instruction state. The pointer on the object controls the position of the object on the input queue QID for the decode phase. In this manner, the created object (instruction state class) can be "passed" through the pipeline. When it reaches the write back phase, its life cycle is complete, it is read from the input queue of that phase and the object is deleted.

The signal input and signal output classes provide a mechanism for simulating various effects in a processor. For example, they can be used in managing the effect of a branch. When a branch instruction is executed, the fetch phase must be informed so that the next object which it creates is the instruction state class for an instruction at a different location. Also, the decode phase must be informed so that it can delete objects representing now redundant instructions from its input queue. As illustrated in FIG. 5, this can be done by using the signal classes. A member SignalOutput<address> is added to the execute stage and SignalInput<address> classes are added to the fetch and decode stages.

A processor model class procm is created which includes as members the functional components modelling each of the four phases of the pipeline. The constructor for the class cc(procm) joins all the input and output members of each pipeline component using their connect methods. Queue outputs are connected only to one input but signal outputs may be connected to several inputs.

In order to model the timing aspect of a performance model, a tick method is added to each pipeline component. This is used to model the operations performed by each pipeline component when it is clocked.

As a specific example, the decode component is described in more detail in the following. The decode phase is the second stage in the pipeline. Thus, instructions flow both into and out of the stage. In addition, a signal is received from the execute phase when a branch occurs. A suitable class definition is given in Annexe 2.

Figure 6:
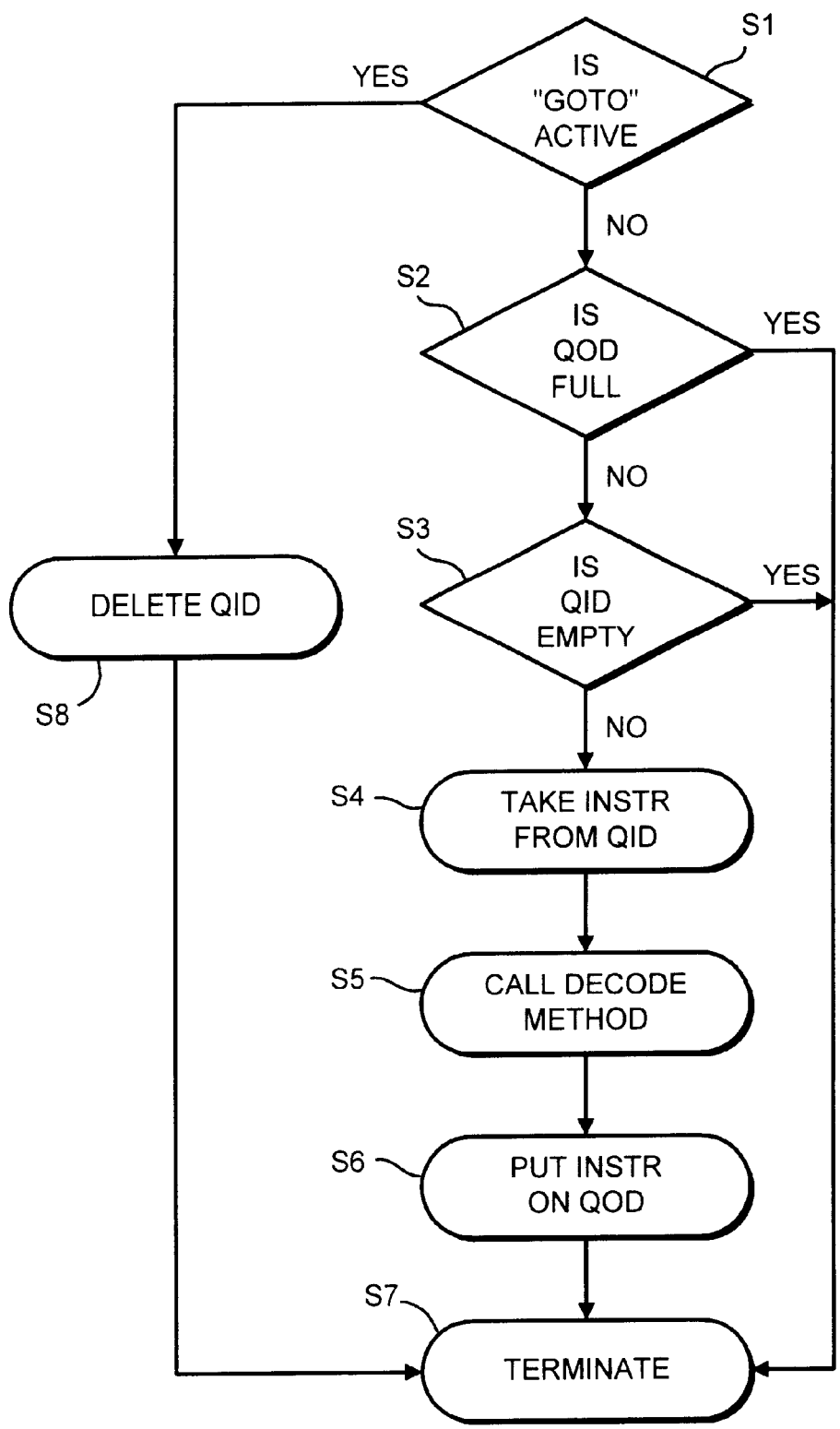
FIG. 6 is a flow chart of a timing method for implementing a performance model.

FIG. 6 illustrates how the tick method behaves for the decode phase. The core of the method is defined in steps S4 to S7. According to step S4, an instruction is taken from the front of the input queue QID. The decode method (is.decode) is called for that instruction. The instruction is then placed according to step S6 on the back of the output queue QOD. According to step S7, the method is then terminated. The method is also terminated in circumstances determined by steps S1,S2 and S3. According to step S1, it is determined whether or not a branch is active. If so, all instructions are deleted from the input queue in step S8 and the method is terminated. According to step S2, it is determined whether or not the output queue is full. If it is, the method is terminated. According to step S3, it is determined whether or not the input queue is empty. If it is, the method is terminated. Annexe 3 describes a sequence of code in C++ to implement this. In summary, the advantages of the technique are:

- delivery of very early, but approximate, performance models;
- the ability to refine the model to whatever degree of accuracy is required whilst always retaining full functionality;
- being able to track architecture changes simply by importing a new version of the functional model;
- much less effort is required than that associated with producing a low-level cycle-accurate models.

Annexe 1

```
class InstrState
{
  public;
    InstrState(Address pc, Processor& proc)
    void fetch();
    void decode();
    void register_fetch();
    void execute();
    void retire();
    Address pc;
    TrapState trap;
    Opcode opcode;
    Instruction* instr;
    Operand op[3];
  private:
    Processor& proc;
}
```

Annexe 2

```
class Decode
{
public
  Decode();                    // class constructor (needs do nothing)
```

-continued

```
QueueInput<InstrState*>  input;   // instruction input queue
QueueOutputInstrState*>  output;  // instruction output queue
SignalInput>Address>     goto;    // branch indication signal
void tick();                      // method which clocks decode stage
}
```

Annexe 3

```
void Decode::tick()
{
  if (goto.is_valid())
  {
    while (input.is_valid()) delete input.pop_head();
    return;
  }
  if (!input.is_valid()) return;
  if (output.is_blocked ()) return;
  InstrState* is = input.pop_head();
  is->decode();
  output.push_tail(is);
}
```

What is claimed is:

1. A method of operating a computer to generate electronic data defining a system model, the method comprising:

loading into the computer a class definition defining functional objects which are processed by the system, the class definition including a set of functional methods to which the object is subjected by the system and a set of locations for members representing the object;

executing on the computer a model execution program which calls the class definition for each object, invokes a first functional method of the set of functional methods, and loads, based upon the first functional method, at least a portion of the set of locations with state information to create a functional component, the state information including at least some attributes of the class definition;

loading said functional component into an electronic storage medium;

invoking a second functional method of the set of functional methods; and modifying the state information of the functional component based upon the second functional method.

2. A method according to claim 1, wherein the system is a processor and each of the functional objects defines an object-oriented representation of a computer instruction to be processed by the processor.

3. A method according to claim 2, wherein the class definition comprises as one of the members the address of the instruction in a memory of the processor being modelled.

4. A method according to claim 2, wherein the class definition comprises as one of the members a record of any traps caused by the instruction.

5. A method according to claim 2, wherein the class definition comprises as one of the members the opcode of the instruction describing the effect of the instruction when executed.

6. A method according to claim 2, wherein the class definition comprises as one of the members a pointer to a description of the effect of the instruction when executed.

7. A method according to claim 2, wherein the class definition comprises as one of the members an array of operands including input and output operand values for the instructions.

8. A method according to claim 1, wherein the class definition includes a state location for holding a reference to the architectural state of the system being modelled.

9. A method according to claim 1 which includes associating a timing method with each functional component to generate electronic data defining a performance model.

10. A computer system operable to generate electronic data defining a system model, the computer system comprising:

a memory for holding class definition defining functional objects which are processed by the system, the class definition including a set of functional methods to which the object is subjected by the system and a set of locations for members representing the objects;

a processor for executing a model execution program which calls the class definition for each object, invokes a first functional method of the set of functional methods and loads, based upon the first functional method, at least a portion of the set of locations with state information to create and modify functional components, and invokes a second functional method of the set of functional methods to modify the state information based upon the second functional method; and an electronic storage medium in which said functional components are stored and modified to generate the system model.

11. An object-oriented method for simulating a processing of items in a pipelined process that includes a plurality of sequential phases, the plurality of sequential phases having a predetermined order of execution, the method comprising acts of:

providing a plurality of phase objects, each phase object defining an object-oriented representation of a corresponding one of the plurality of sequential phases of the pipelined process;

providing a first item object corresponding to a first item, the first item object defining an object-oriented representation of the first item, the representation including state information corresponding to properties of the first item; and simulating the processing of the first item in the pipelined process by sequentially, and according to the predetermined order of execution, using each of the plurality of phase objects to instruct the first item object to update the state information of the first item object.

12. The method of claim 11, wherein the first item is a computer instruction and the object-oriented representation defined by the first item object is a representation of the computer instruction.

13. The method of claim 11, wherein the representation defined by the first item object includes a timing method for generating data defining a performance model.

14. The method of claim 11, wherein the step of simulating the processing of the first item further comprises using transfer objects to allow a subsequent phase object in the predetermined order of execution to instruct the first item object after a preceding phase object in the predetermined order of execution has completed instructing the first item object.

15. The method of claim 11, further comprising acts of:

providing a plurality of additional items, the plurality of additional items having a sequence, each of the plurality of additional items having a preceding item according to the sequence;

providing a plurality of additional item objects, each of the plurality of additional item objects respectively corresponding to one of the plurality of additional items and each of the plurality of additional item objects defining an object-oriented representation of the corresponding additional item, the representation including state information corresponding to the properties of the corresponding additional item;

defining a sequence of the plurality of additional item objects corresponding to the sequence of the plurality of additional items; and simulating the processing of each of the plurality of additional items by sequentially, and according to the predetermined order of execution for clarification of the plurality of sequence phases, using each of the plurality of phase objects to instruct each of the plurality of additional item objects to update state information of the corresponding item, each phase object instructing each of the plurality of additional item objects according to the sequence of the plurality of additional item objects.

16. The method of claim 15, wherein each of the plurality of additional items is a respective computer instruction and the object-oriented representation defined by each of the plurality of additional item objects is a representation of the respective computer instruction.

17. The method of claim 15, wherein the object-oriented representation defined by each of the plurality of additional item objects includes a timing method for generating data defining a performance model.

* * * * *